(12) United States Patent
Reber

(10) Patent No.: US 6,555,915 B1
(45) Date of Patent: Apr. 29, 2003

(54) INTEGRATED CIRCUIT HAVING INTERCONNECT TO A SUBSTRATE AND METHOD THEREFOR

(75) Inventor: Douglas M. Reber, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/986,232

(22) Filed: Oct. 22, 2001

(51) Int. Cl.⁷ .................. H01L 29/40; H01L 31/072
(52) U.S. Cl. .............. 257/773; 257/187; 257/197; 257/E 29.061; 257/E 29.117
(58) Field of Search ................ 257/405, 410, 257/27, 67, 69, 187, 192, 366, E 29.05, E 29.061, E 29.117, E 29.205, E 29.242, E 29.273

(56) References Cited

U.S. PATENT DOCUMENTS

| | | | | |
|---|---|---|---|---|
| 6,027,961 A | * | 2/2000 | Maiti et al. | 438/199 |
| 6,074,904 A | * | 6/2000 | Spikes, Jr. et al. | 438/233 |
| 6,077,748 A | * | 6/2000 | Gardner et al. | 438/296 |
| 6,373,113 B1 | * | 4/2002 | Gardner et al. | 257/411 |
| 6,392,275 B1 | * | 5/2002 | Jang | 257/343 |
| 6,399,468 B2 | * | 6/2002 | Nishibe et al. | 438/592 |

OTHER PUBLICATIONS von Borany et al., "The Formation of Narrow Nanocluster Bands in Ge–implanted $SiO_2$–layers," Pergamon, Solid–State Electronics 43 (1999) pp. 1159–1163.

Kim et al., "Electrical Properties of Si–Implanted Gate Oxides," Electronics Letters, Jan. 7th, 1993 vol. 29 No. 1, pp. 34–35.

von Borany et al., "Multimodal Impurity Redistribution and Nanocluster Formation in Ge Implanted Silicon Dioxide Films," American Institute of Physics, Appl. Phys. Lett. 71 (22), Dec. 1, 1997, pp. 3215–3217.

Kameda et al., "Study of the current–voltage characteristics in MOS capacitors with Si–implanted gate oxide, " Pergamon, Solid–State Electronics 43 (1999) pp. 555–563.

Kameda et al., "Interface State Density in n–MOSFETs with Si–implanted Gate Oxide Measured by Subthreshold Slope Analysis," Pergamon, Solid–State Electronics 43 (1999) pp. 565–573.

Matsuda et al., "Direct–Current and Alternating–Current Electroluminescence of MOS Capacitors with Si–Implanted $SiO_2$," Pergamon, Solid–State Electronics vol. 42, No. 1, pp. 129–138 (1998).

* cited by examiner

Primary Examiner—Jasmine J B Clark
(74) Attorney, Agent, or Firm—James L. Clingan, Jr.; Kim-Marie Vo

(57) ABSTRACT

A contact between a source/drain and a gate is made by making a selected portion of the gate dielectric conductive by an implant into that selected portion of the gate dielectric. The gate material is in a layer over the entire integrated circuit. Areas where gates are to connect to source/drains are indentified and the gate dielectric at those identified locations is implanted to make it conductive. The source/drains are formed so that they extend under these areas of conductive gate dielectric so that at these locations the implanted gate dielectric shorts the gate to the source/drain. This saves area on the integrated circuit, reduces the need for interconnect layers, and avoids the problems associated with depositing and etching polysilicon on an exposed silicon substrate.

17 Claims, 3 Drawing Sheets

INTEGRATED CIRCUIT HAVING INTERCONNECT TO A SUBSTRATE AND METHOD THEREFOR

BACKGROUND OF THE INVENTION

1. Field of the Invention

This invention relates to integrated circuits and more particularly to making contact between interconnect and substrate.

2. Related Art

Integrated circuits comprise transistors formed in active regions that are interconnected by interconnect layers. Typically, these interconnect layers are polysilicon or metal that are made in layers above the substrate. Active regions are formed in the substrate itself. A relatively simple connection that is commonly required in the integrated circuit is a source/drain of one transistor connected to a gate of another transistor. Typically, this occurs by providing an interconnect layer for making the connection from a layer that is above the gate. This requires area on the integrated circuit and thus is a factor in the overall size of the integrated circuit. Another type of contact that has been utilized is known as a buried contact in which polysilicon, which is the typical gate material, is in direct contact with the substrate for making contact between a source/drain and gate.

One of the difficulties and problems associated with buried contacts is that the substrate tends to be excessively etched in the area immediately adjacent to or at the edge of the polysilicon that was making contact to the substrate. This occurs because the opening to the substrate, and thus to the source/drain, must be made before the polysilicon is deposited. Thus the etch of the polysilicon that is used for the contact can create a substrate overetch problem.

Thus there is a need for contacts that do not require as much space as those of upper level interconnect and do not have the problems associated with buried contacts.

DESCRIPTION OF THE INVENTION

A standard connection of a drain to a gate is achieved by an implant into gate dielectric material to achieve a connection between a source/drain formed in a substrate and a gate of another transistor. The connection between the gate material and the substrate, and thus source/drain, is achieved by implanting into the gate material in that area so that the gate dielectric becomes conductive in that location. This is better understood by reference to the figures and the following description.

Figure 1:
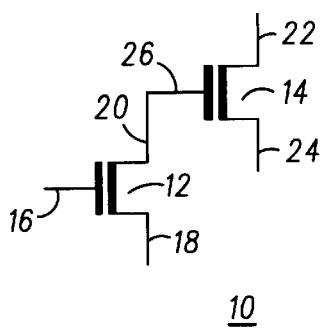
FIG. 1 is a circuit diagram of a circuit known in the prior art.

Shown in FIG. 1 is a circuit 10 that is known in the prior art and is very common in integrated circuits but which is made differently than that of the prior art and configured differently than that of the prior art. Circuit 10 comprises a transistor 12 and a transistor 14. Transistor 12 has a gate 16, a source/drain 18, and a source/drain 20. As used herein a source/drain is the doped region adjacent to a gate that can be a source or a drain, depending how it is used in a given circuit. Transistor 14 has a source/drain 22 and a source/drain 24. Source/drains 18, 22 and 24 are shown as not being connected but in a completed circuit would have connections to either other circuitry or to power supply terminals. Similarly, gate 16 would be connected to other circuitry or a reference or signal. Source/drain 20 is connected to gate 26 of transistor 14. A source/drain to gate connection is very common in integrated circuits.

Figure 2:
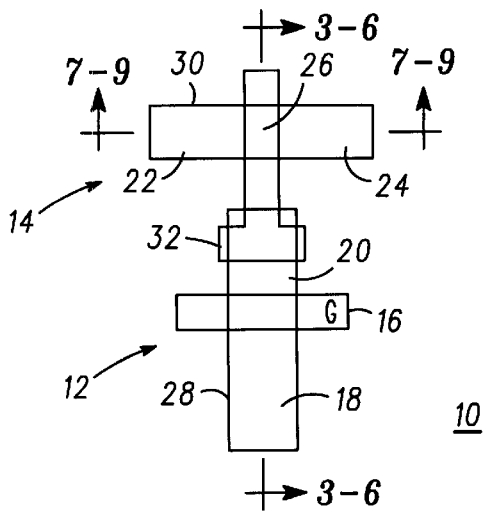
FIG. 2 is a top view of the circuit of FIG. 1 made according to an embodiment of the present invention.

Shown in FIG. 2 is circuit 10 in a layout according to an embodiment of the invention. Circuit 10 comprises an active region 28 and an active region 30. Active region 28 is for forming transistor 12 and active region 30 is for forming transistor 14. Gate 26 overlies active region 30 and is connected to source/drain region 20 of transistor 14 at a contact 32. Active region 28 has gate 16 overlying it and contains source/drain regions 18 and 20. Active region 30 contains source/drain regions 22 and 24. Contact 32 is achieved by having at least a portion of that region implanted so that gate dielectric material becomes conductive in that area. Thus, gate 26, which extends over active region 18, makes contact with drain 20 through contact 32.

Figure 3:
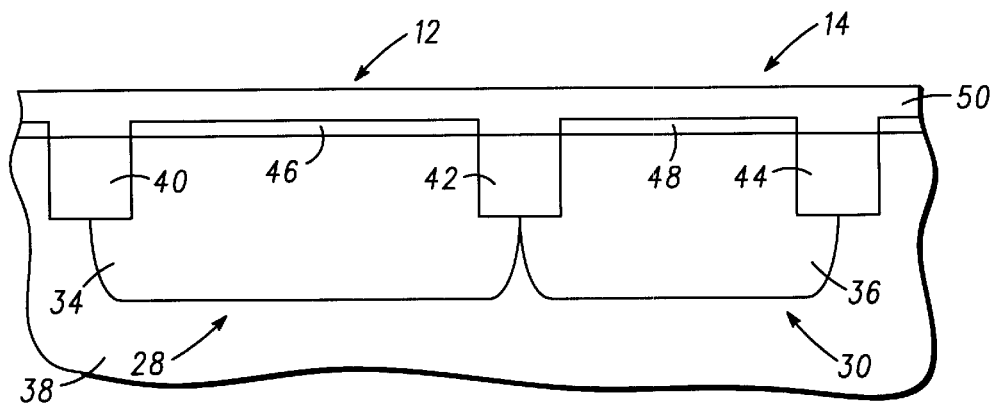
FIGS. 3–6 are sequential cross-sections in processing of a portion of the circuit of FIG. 2.

Shown in FIG. 3 is a cross-section showing transistors 12 and 14 at a relatively early stage in processing. This stage in processing is conventional. Circuit 10 comprises a substrate 38, which is P-, having a P-well 34 and an N-well 36. Substrate 38 is shown as having conductive material 50 over P-well 34 and N-well 36 and overlying gate dielectric material 46 and 48. P-well 34 is between isolation regions 40 and 42. N-well 36 is between isolation regions 42 and 44 as shown in FIG. 3. Overlying FIG. 3 between isolation regions 40 and 42 is gate dielectric material 46 and between isolation regions 42 and 44 is gate dielectric material 48. Overlying gate dielectric material 46 and 48 is polysilicon layer 50. Substrate 38 may also be silicon on insulator (SOI) in which case there would be a semiconductor layer over an in insulator. Wells 34 and 36 would be in the semiconductor layer and isolation regions 40, 42, and 44 would extend to the insulator.

Figure 4:
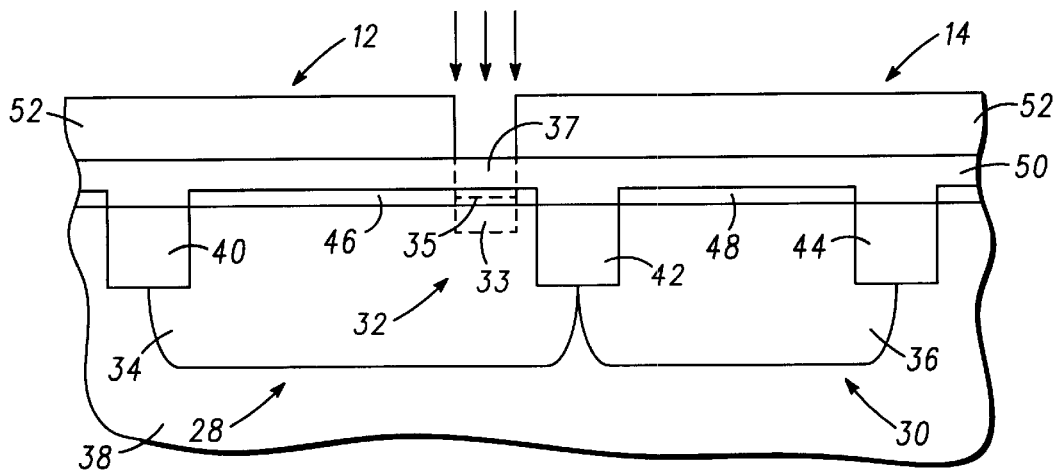

Shown in FIG. 4 is circuit 10 after photoresist 52 has been deposited and patterned so that there is an opening at a location for contact 32 in active region 28. This shows an implant that has its center depth at dielectric material 46 in contact area 32. The result is a doped region 33 in P-well 34, an implanted gate dielectric 35, and an implanted polysilicon region 37. An effective dopant material is boron for the purpose of causing dielectric material 46 at contact 32 to be highly conductive. Gate dielectric material may be other materials and instead of polysilicon the gate electrode may be formed of other materials as well. In such cases it may be desirable to provide a different dopant than boron to form the needed conduction and short circuit between the gate dielectric material and the overlying gate material. One such dopant may be aluminum, and another may be phosphorus. It may be advantageous to use phosphorus, which causes N-type conductivity, when implanting into the P-well. A gate dielectric material other than silicon oxide may be hafnium oxide. Other materials may be chosen as well. Thus, a short circuit is formed to the polysilicon without the polysilicon having to have been etched prior to forming the short circuit. In conventional buried contacts it is necessary to open the well or area to be contacted followed by a polysilicon deposition. The subsequent etching is not only cumbersome in terms of the sequence but also can form the etched out areas of the substrate adjacent to the area where the polysilicon is etched after the substrate has been exposed.

Figure 5:
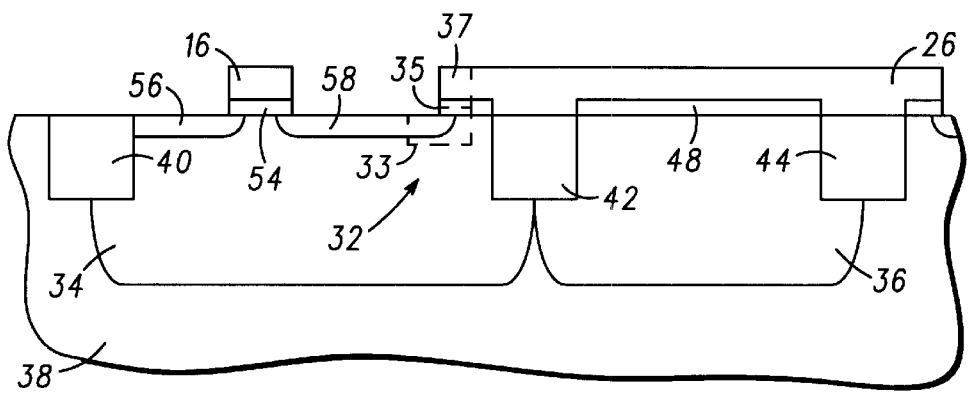

Shown in FIG. 5 is polysilicon 50 and gate materials 46 after a patterned etch to leave gate 16 over gate dielectric 54 formed of gate dielectric material 46. Also, a source/drain extension 56 and a source/drain extension 58 are formed using gate 16 as a mask. Source/drain extensions 56 and 58 are N-type formed by implanting a combination of arsenic and phosphorus. The particular species and combination of species for implanting may vary as needed. Also left is gate 26 that extends to contact area 32. Thus, gate 26 overlaps the region of gate dielectric material that was implanted. The portion, of the gate dielectric that was implanted is the portion that ultimately forms the contact between gate 26 and drain 20 so some of this implanted gate material must remain after the etch of polysilicon 50. It may be desirable to have a combination boron and indium halo implant before extensions 56 and 58. This halo implant is not shown because halo implants are well understood in the art and for not unnecessarily complicating the drawings.

Figure 6:
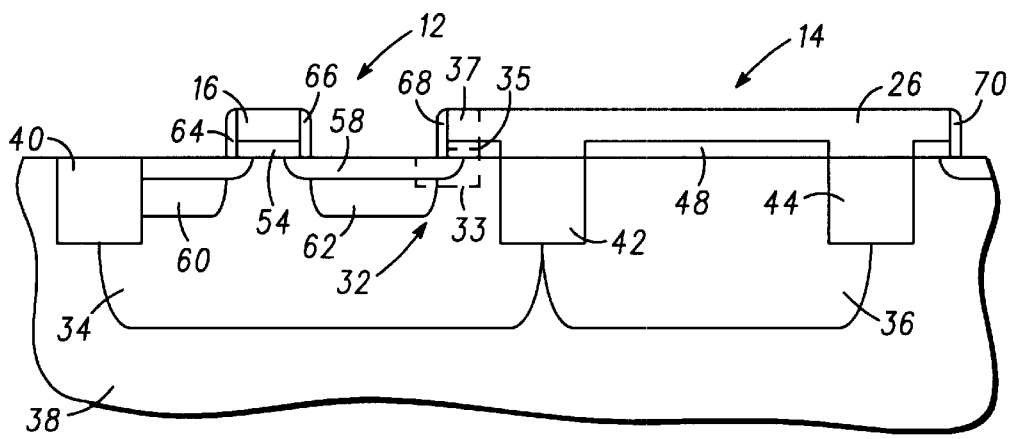

Shown in FIG. 6 is a circuit 10 after sidewall formation and a combination arsenic and phosphorus implant to form heavily doped source/drain regions 60 and 62. Gate 16 has sidewall spacers 64 and 66. Gate 26 has sidewall spacers 68 and 70. This shows a completed transistor 12 of the N-channel type and completed transistor 14 of the P-channel type. Gate 26 is connected to drain 20 at contact 32. Drain 20 is made up of heavily doped region 62 and extension region 58. If contact area 32 is implanted with phosphorus, the contact area may extend past source/drain extension 58 as shown in FIG. 6. If, however, contact area 32 is doped with boron, which forms P-type regions, then contact area 32 should not extend laterally past source/drain extension 58. The doped region of the gate dielectric material is conductive and thus will make contact with the doped region under it. If this doped gate dielectric is only in contact with the source/drain, then it will only short gate 26 to drain 20 and not to well 34. If the doped portion of the gate dielectric extends laterally past drain 20, then it should be in contact with a doped region of a conductivity type opposite to that of well 34 and thus the implant of the gate dielectric as shown in FIG. 6 should form N-type regions.

Figure 7:
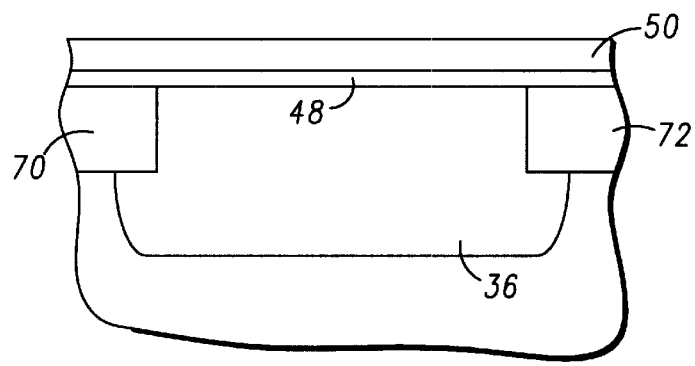
FIGS. 7–9 are sequential cross-sections in processing of another portion of the circuit of FIG. 2.

Shown in FIG. 7 is transistor 14 at the same stage in processing as that shown in FIG. 3. In this cross section, FIG. 7 shows N-well 36 and isolation regions 70 and 72 as well as gate dielectric material 48.

Figure 8:
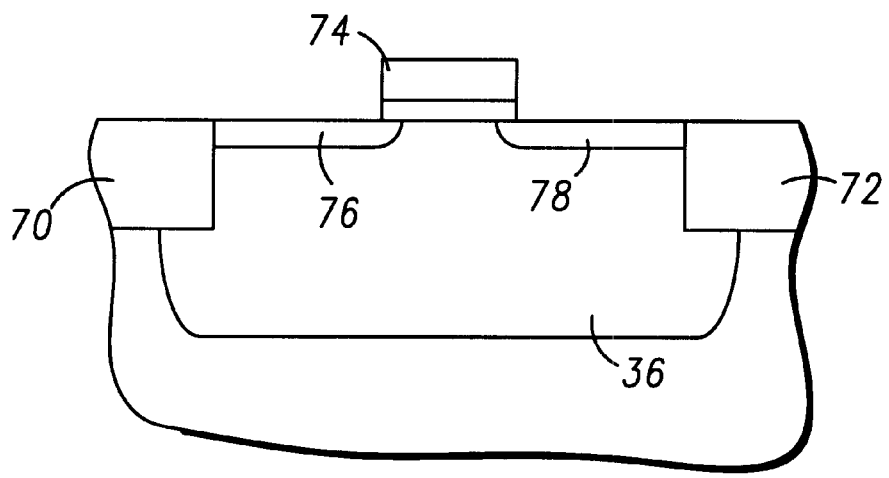

Shown in FIG. 8 is transistor 14 after polysilicon 50 has been etched to form gate 74 and source/drain extensions 76 and 78. These extensions are formed in a manner analogous to that shown in FIG. 5 but at a different process step because the doping type is different for transistor 12 than for transistor 14. These source/drain extensions are formed by implanting a combination of arsenic and boron. The steps required for FIG. 8 may be either before or after those for FIG. 5.

Figure 9:
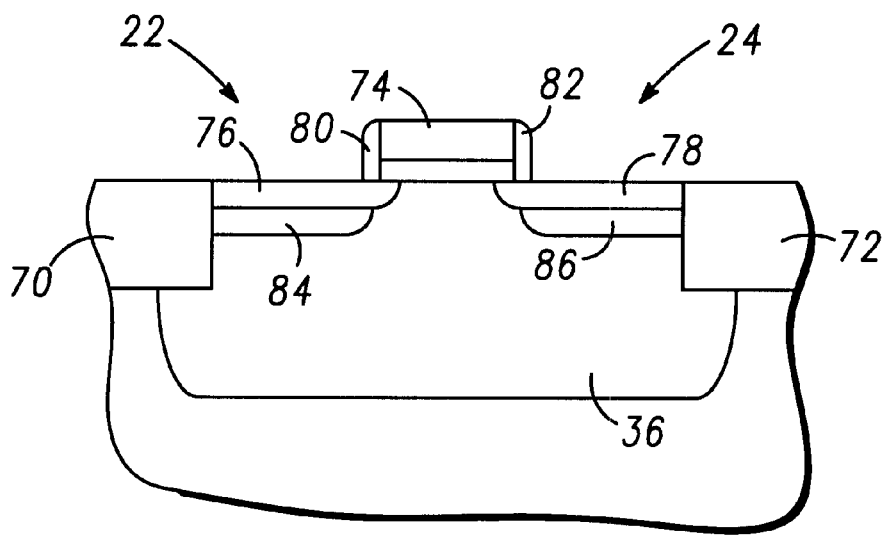

Shown in FIG. 9 is a completed transistor 14 after formation of sidewall spacers 80 and 82 that provide a mask for formation of heavily doped source/drain regions 84 and 86 to complete formation of source/drain region 22 and source/drain region 24 formed by implants using a combination of boron.

Thus is it seen that a completed circuit 10, as shown in cross-sections 3–6 and cross-sections 7–9, show a completed transistor 12 and a completed transistor 14 having a drain of transistor 12 connected to the gate of transistor 14 without having to apply a conductive material over a source/drain in order to make that contact. This avoids the problems associated with buried contacts and provides very compact interconnect between the drain of one transistor and the gate of another. This has the effect of reducing the need for higher level interconnect thus reducing complexity of processing and opportunities for defects. Thus, by having the reduced area, the chip area is reduced overall providing an opportunity to provide a lower cost without significant process complications.

Also a similar benefit may be achieved by a circuit feature other than a transistor such as a resistor. Another circuit feature may have an electrode, such as polysilicon gate 26, extending over a source/drain and making electrical contact thereto by way of a conductive implanted dielectric such as region 35 shown in FIGS. 4, 5, and 6.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other, variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device comprising:
    a first transistor comprising:
        a first gate electrode formed over the first gate dielectric;
        a first conductive region formed within a substrate and adjacent the first gate dielectric;
        a second conductive region formed within the substrate and adjacent the first gate dielectric; and
        a first gate dielectric formed over the substrate; and
    a second transistor comprising:
        a second gate electrode formed over the first gate dielectric;
        a third conductive region formed within the substrate and adjacent the second gate dielectric;
        a fourth conductive region formed within the substrate and adjacent the second gate dielectric; and
        a second gate dielectric formed over the substrate; and
    wherein:
        the second gate electrode is part of a conductive layer; the conductive layer electrically contacts a conductive doped dielectric; and
        the conductive doped dielectric is electrically connected to the first conductive region.

2. The device of claim 1, wherein a portion of the conductive layer overlies the conductive doped dielectric.

3. The device of claim 1, wherein the first conductive region is electrically isolated from the third and fourth conductive regions.

4. The device of claim 1, wherein the conductive doped dielectric is a heavily doped oxide layer.

5. The device of claim 1, wherein the first transistor is in an n-type well and the second transistor are in a p-type well.

6. The device of claim 1, further comprising:
    a doped area of the semiconductor substrate under the conductive doped dielectric, wherein the conductive doped dielectric and the doped area are doped with a species with a first conductivity and the doped area overlaps the first conductive area.

7. The device of claim 4, wherein the conductive doped dielectric is silicon dioxide and is doped with an element selected from the group consisting of:

phosphorus, boron, aluminum, gallium, germanium, indium, arsenic, tungsten, and silicon.

8. The device of claim 6, wherein the first conductive area is doped to a conductivity different than the doped area.

9. The device of claim 6, wherein the first conductivity is p-type.

10. The device of claim 6, wherein the first conductivity is n-type.

11. The method of claim 6, wherein the first conductive area is more heavily doped than the doped area.

12. A semiconductor device comprising:
   a first active area;
   a second active area;
   a first dielectric layer over a first portion of the first active area;
   a first conductive layer over the first dielectric layer;
   a second dielectric layer over-the second active area;
   a first portion of a second conductive layer over the second dielectric layer;
   a conductive doped dielectric over a second portion of the first active area; and
   a second portion of the second conductive layer over the conductive doped dielectric and the first active area.

13. The device of claim 12, wherein the third dielectric layer is electrically connected to a conductive area adjacent the first dielectric layer and the first conductive layer.

14. The device of claim 12, wherein the conductive area is a source/drain region.

15. The device of claim 12, wherein the conductive doped dielectric is silicon dioxide and the dopant is selected from the group consisting of: phosphorus, boron, aluminum, gallium, germanium, indium, arsenic, tungsten, and silicon.

16. The device of claim 12, wherein a salicide is formed over the first and second conductive layers.

17. An integrated circuit, comprising:
   a substrate having a first well region;
   a transistor formed in the first well region having a first source/drain region in the first well region and a second source/drain region;
   a circuit feature having a conductive electrode extending over the first source/drain region and physically, separated from the first source/drain by a conductive implanted dielectric, wherein the conductive implanted dielectric electrically shorts the conductive electrode to the first source/drain region.

* * * * *